(12) United States Patent
Stum et al.

(10) Patent No.: US 7,691,711 B2
(45) Date of Patent: Apr. 6, 2010

(54) METHOD FOR FABRICATING SILICON CARBIDE VERTICAL MOSFET DEVICES

(75) Inventors: Zachary Matthew Stum, Niskayuna, NY (US); Kevin Sean Matocha, Rexford, NY (US); Jody Alan Fronheiser, Selkirk, NY (US); Ljubisa Dragoljub Stevanovic, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 246 days.

(21) Appl. No.: 12/023,369

(22) Filed: Jan. 31, 2008

(65) Prior Publication Data

US 2009/0194772 A1 Aug. 6, 2009

(51) Int. Cl.
*H01L 21/336* (2006.01)
(52) U.S. Cl. .................. 438/268; 438/607; 257/328; 257/E29.118; 257/E29.121; 257/E21.41
(58) Field of Classification Search ................. 438/268, 438/607; 257/328, E29.118, E29.121, E21.41
See application file for complete search history.

(56) References Cited

U.S. PATENT DOCUMENTS

| 5,705,406 | A | 1/1998 | Tottner et al. |
| 6,313,482 | B1 | 11/2001 | Baliga |
| 6,750,524 | B2 | 6/2004 | Parthasarthy et al. |
| 6,853,006 | B2 | 2/2005 | Kataoka et al. |
| 7,042,046 | B2 | 5/2006 | Onishi et al. |
| 7,381,992 | B2* | 6/2008 | Ryu ............................ 257/77 |
| 2006/0097267 | A1 | 5/2006 | Kumar et al. |

2006/0131644 A1 6/2006 Saito et al.

OTHER PUBLICATIONS

"High Voltage Thin Layer Devices (Resurf Devices)" Appels, J.A.; Vaes, H. M. J.; Philips Research Laboratories, Eindhoven, The Netherlands; 1979 IEEE; pp. 238-244.

Proceedings of 1998 International Symposium on Power Semiconductor Devices & ICs, Kyoto. "Simulated Superior Performances of Semiconductor Superjunction Devices" Fujihira, Tatsuhiko; Miyasaka, Yasushi. pp. 423-426.

1999 IEEE. "COOLMOS™—a new milestone in high voltage Power MOS" Lorenz, L.; Deboy, G.; Knapp, A.; Marz, M. pp. 3-10.

(Continued)

*Primary Examiner*—Tu-Tu V Ho
(74) *Attorney, Agent, or Firm*—Penny A. Clarke

(57) ABSTRACT

A method of forming a vertical MOSFET device includes forming a first trench within a semiconductor layer of a first polarity, the first trench generally defining a well region of a second polarity opposite the first polarity; growing a first epitaxial well layer of the second polarity over the original semiconductor layer; growing a second epitaxial source contact layer of the first polarity over the well layer; forming a second trench through the source contact layer and at least a portion of the well layer; growing a third epitaxial layer of the second polarity over the source contact layer; and planarizing at least the first and second epitaxial layers so as to expose an upper surface of the original semiconductor layer, wherein a top surface of the third epitaxial layer is substantially coplanar with a top surface of the source contact layer prior to ohmic contact formation.

25 Claims, 20 Drawing Sheets

OTHER PUBLICATIONS

Journal of Electronic Materials, vol. 31, No. 5, 2002. "Stacking-Fault Formation and Propagation in 4H-SiC PiN Diodes" Stahlbush, R. E.; Fatemi, M.; Fedison, J. B.; Arthur, S.D.; Rowland, L. B.; Wang, S. pp. 370-375.

Institute of Physics Publishing. Semiconductor Science and Technology, vol. 17, Aug. 9, 2002. "Carrier mobility model for simulation of SiC-based electronics devices" Mnatsakanov, T. T.; Levinshtein, M. E.; Pomortseva, L. I.; Yurkov, S. N. pp. 974-977.

IEEE Transactions on Electron Devices, vol. 50, No. 3, Mar. 2003. "High Temperature SiC Trench Gate p-IGBTs" Singh, Ranbir; Ryu, Sei-Hyung; Capell, D. Craig; Palmour, John W. pp. 774-784.

IEEE Transactions on Electron Devices, vol. 51, No. 3, Mar. 2004. "On the Specific On-Resistance of High-Voltage and Power Devices" Zingg, Rene P. pp. 492-499.

Proceedings of the 17th International Symposium on Power Semiconductor Devices & IC's, May 23-26, 2005, Santa Barbara, CA. "Evolution of the 1600 V, 20 A, SiC Bipolar Junction Transistors" Agarwal, Anant K.; Krishnaswami, Sumi; Richmond, James; Capell, Craig; Ryu, Sei-Hyung; Palmour, John W.; Balachandran, Santosh; Chow, T. Paul; Bayne, Stephen; Geil, Bruce; Scozzie, Charles; Jones, Kenneth A.; pp. 1-3, 162.

* cited by examiner

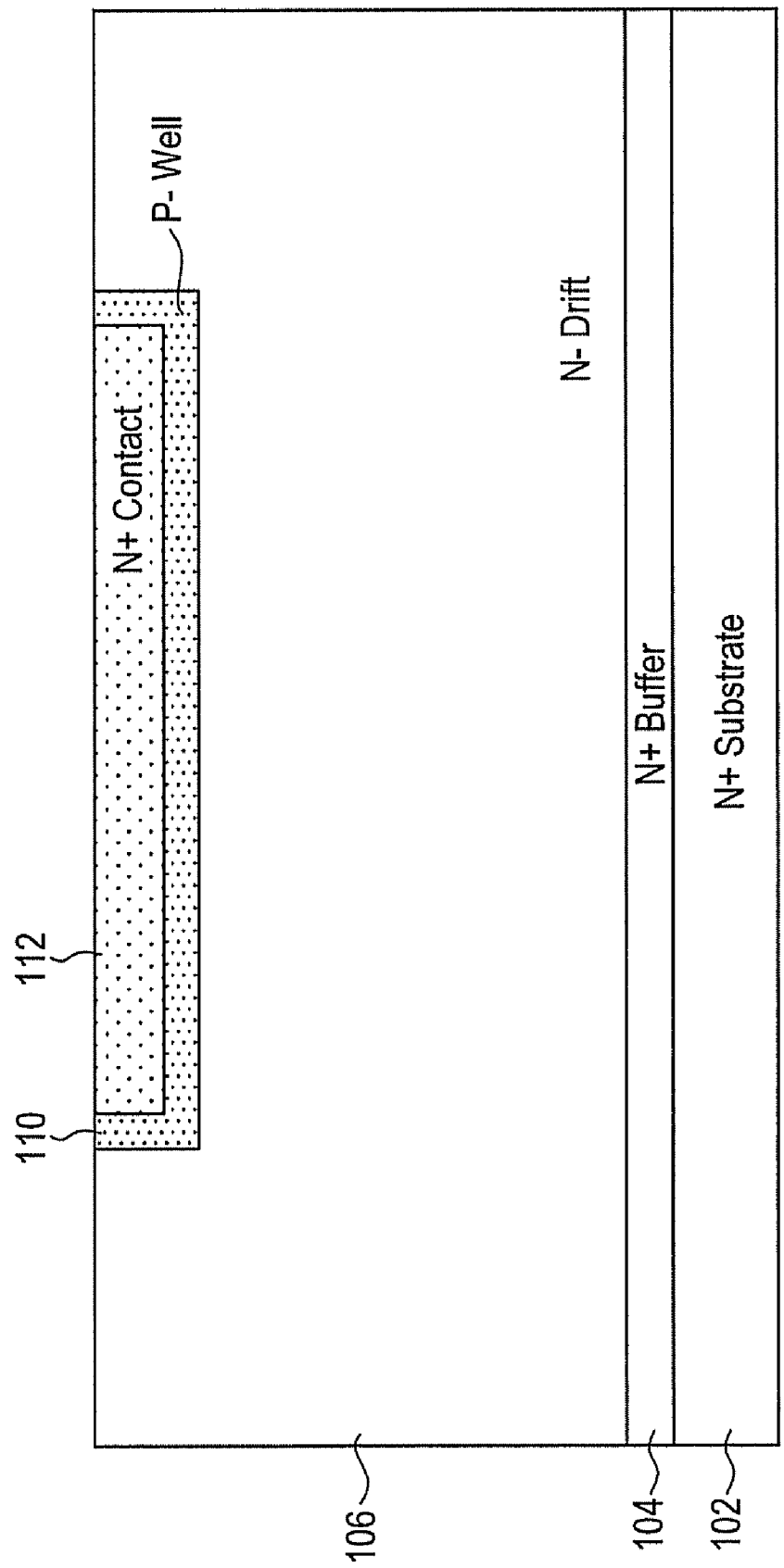

METHOD FOR FABRICATING SILICON CARBIDE VERTICAL MOSFET DEVICES

BACKGROUND OF THE INVENTION

The invention relates generally to power semiconductor switching devices and, more particularly, to a method for forming silicon carbide vertical MOSFET devices having improved channel length uniformity for decreased channel resistance.

Silicon carbide (SiC) is a wide band gap material having a maximum breakdown electric field larger than that of silicon by about one order of magnitude. Thus, SiC has been considered as an advantageous material for use in the manufacture of next generation power semiconductor devices. Such devices include, for example, Schottky diodes, thyristors and vertical MOSFETs (metal oxide semiconductor field effect transistors).

Most power MOSFETs have a different structure than commonly known "lateral" MOSFETs, in that their electrical flow path is vertical and not planar. With a lateral structure, the current and breakdown voltage ratings of the MOSFET are both a function of the channel dimensions (respectively, the width and length of the channel), resulting in inefficient use of the device real estate. With a vertical structure, the voltage rating of the transistor is a function of the doping and thickness of the epitaxial layer, while the current rating is a function of the channel width and length. This makes it possible for the transistor to sustain both high blocking voltage and high current within a compact piece of semiconductor material.

In a conventionally formed vertical MOSFET (also referred to as a DMOSFET, or generally DMOS), selective area P-well regions are formed within a surface layer of a lightly doped N− drift layer (in an N-type device). In turn, selective area N+ source regions and more heavily doped P+ regions (for ohmic contact to the P-well) are formed within each P-well region to facilitate the vertical flow of drift current. A device channel length is thereby defined by the distance between the outer edges of the N+ source region and the outer edges of the P-well containing the N+ source region.

Because such regions within the drift layer are conventionally formed by dopant implantation using lithographically patterned masks, there is the potential for inconsistent channel lengths, as well as damage to the channel region due to the implantation steps themselves. These can, in turn, result in increased channel resistance. Moreover, the formation of multiple doped regions results in the use of several lithography mask levels, which increases device manufacturing costs and decreases throughput.

Accordingly, it would be desirable to be able to manufacture a SiC power switching device (e.g., DMOSFET) that provides a more uniform aligned channel with decreased resistance.

BRIEF DESCRIPTION OF THE INVENTION

The above and other drawbacks and deficiencies of the prior art may be overcome or alleviated by an embodiment of a method of forming a vertical MOSFET device, the method including forming a first trench within a substrate of a first polarity type, the first trench generally defining a well region of a second polarity type opposite the first polarity type; growing a first epitaxial layer of the second polarity type over the substrate and sidewall surfaces of the trench, the first epitaxial layer comprising a well layer; growing a second epitaxial layer of the first polarity type over the well layer of the second polarity type, the second layer comprising a source contact layer; forming a second trench through the source contact layer and at least through a portion of the well layer; growing a third epitaxial layer of the second polarity type over the source contact layer so as to refill the second trench; and planarizing at least the first and second epitaxial layers so as to expose an upper surface of the substrate, wherein a top surface of the third epitaxial layer is substantially coplanar with a top surface of the source contact layer prior to a subsequent ohmic contact formation therebetween.

In another embodiment, a method of forming a vertical MOSFET device includes forming a drift layer over a drain region substrate, with a buffer layer therebetween, the drift layer, buffer layer and drain region comprising a first polarity type with the drain region having a greater dopant concentration with respect to the drift layer; forming a first trench within the drift layer, the first trench generally defining a well region of a second polarity type opposite the first polarity type; forming a lower region of the second polarity type at the bottom of the first trench over the drift layer; growing a first epitaxial layer of the second polarity type over the drift layer, sidewall surfaces of the trench and the lower region of the second polarity type, the first epitaxial layer comprising a well layer; growing a second epitaxial layer of the first polarity type over the well layer of the second polarity type, the second layer comprising a source contact layer; forming a second trench through the source contact layer and at least through a portion of the well layer; growing a third epitaxial layer of the second polarity type over the source contact layer so as to refill the second trench, wherein the third epitaxial layer of the second polarity type comprises an upper region of the second polarity type; and planarizing at least the first and second epitaxial layers so as to expose an upper surface of the drift layer, wherein a top surface of the third epitaxial layer is substantially coplanar with a top surface of the source contact layer prior to a subsequent ohmic contact formation therebetween.

In still another embodiment, a vertical MOSFET device includes a drift layer formed over a drain region substrate, the drift layer and drain region comprising a first polarity type with the drain region having a greater dopant concentration with respect to the drift layer; a well region formed in an upper portion of the drift layer, the well region of a second polarity type opposite the first polarity type, the well region further comprising a first epitaxially grown region; a source contact region of the first polarity type surrounded at side and bottom surfaces thereof by the well region, the source contact region comprising a second epitaxially grown region; and a third epitaxially grown region formed through the source contact region and the well region so as to make electrical contact therewith; wherein a top surface of the third epitaxially grown region and a top surface of the source contact region are substantially coplanar with one another.

These and other advantages and features will be more readily understood from the following detailed description of preferred embodiments of the invention that is provided in connection with the accompanying drawings.

BRIEF DESCRIPTION OF THE DRAWINGS

FIGS. 18 through 20 are a series of process flow diagrams illustrating an alternative processing sequence applicable to the embodiments of FIGS. 13-17.

DETAILED DESCRIPTION OF THE INVENTION

Channel mobility is the dominant factor that determines on-state conduction losses (and thus the efficiency) of DMOSFET devices. Decreased mobilities can come from ion implantation of dopants into silicon carbide. Another fabrication approach (as outlined in more detail in U.S. application Ser. No. 11/466,488, assigned to the assignee of the present application) utilizes epitaxial growth of both a P-well layer and an N+ layer over an implanted P+ layer to alleviate some of the problems associated with implanting each device region as discussed above. In the '488 application, a vertical ohmic contact process is used to electrically connect the source contact to the buried P+ contact.

Accordingly, embodiments of the invention disclosed herein include a method for forming silicon carbide vertical MOSFET devices having improved channel length uniformity for decreased channel resistance. Briefly stated, the present embodiments involve etching trenches in silicon carbide, then filling the trenches with a two-layer epitaxial silicon carbide pair (e.g., a p-type channel and a N-type source). However, instead of planarizing the device thereafter and forming an ohmic contact to couple the source and buried implanted P+ layer, a narrower trench inside the horizontal boundaries of the first trench is instead formed. This narrower trench is then filled with a p+ epitaxy layer so as to define a full DMOSFET structure. This allows for the creation of a DMOSFET having the same physical structure as an implanted DMOSFET, and further avoids the processing needed to make a vertical ohmic contact to both the N+ source layer and the lower disposed P+ layer. Thus configured, a subsequent ohmic contact process may be carried out in a standard fashion, in that the surfaces to be contacted are substantially co-planar with one another. Consequently, the processing of metal and dielectric layers above the silicon carbide may proceed in the same manner as for a device with all-implanted regions.

Figure 1:
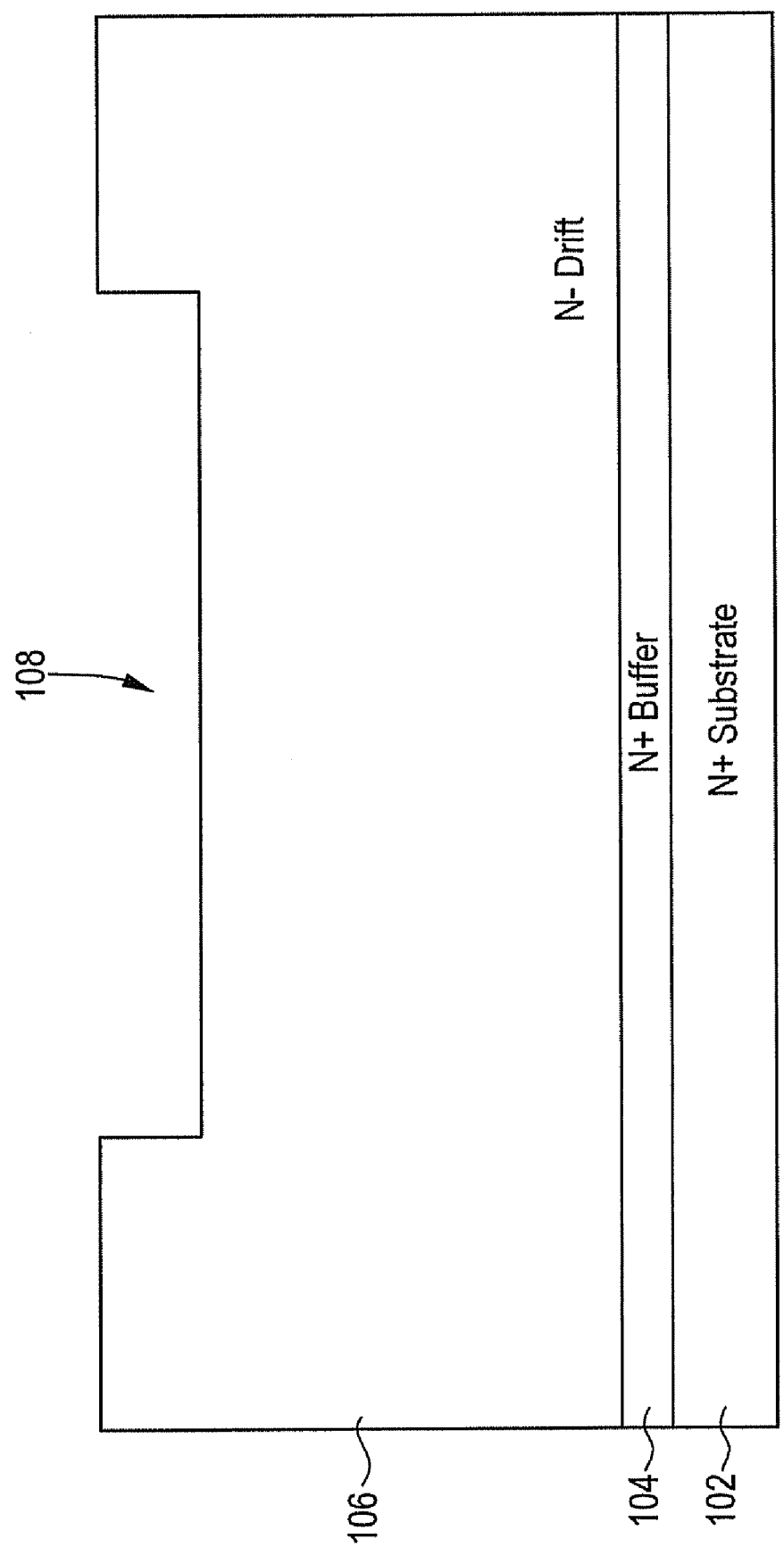
FIGS. 1 through 5 are a series of process flow diagrams illustrating a method of forming a vertical MOSFET device, in accordance with an embodiment of the invention.

Referring initially to FIGS. 1 through 6, there is shown an exemplary process flow sequence for forming a vertical MOSFET device, in accordance with an embodiment of the invention. In FIG. 1, an N+ substrate 102 serves as a drain region of the device, with an N+ buffer layer 104 disposed between the N+ substrate and an N-type drift layer 106, which is epitaxially grown on the N+ buffer layer 104. As used herein, the term "substrate" may refer to a uniform piece of material (e.g., semiconductor material) or a piece of material that has one or more additional layers epitaxially grown or deposited on it. The N+ substrate 102 has a greater dopant concentration with respect to the N-type drift layer 106. As further shown in FIG. 1, a first trench 108 is etched within the N-type drift layer 106, wherein the first trench 108 generally defines the P-well region of the vertical MOSFET device.

Figure 2:
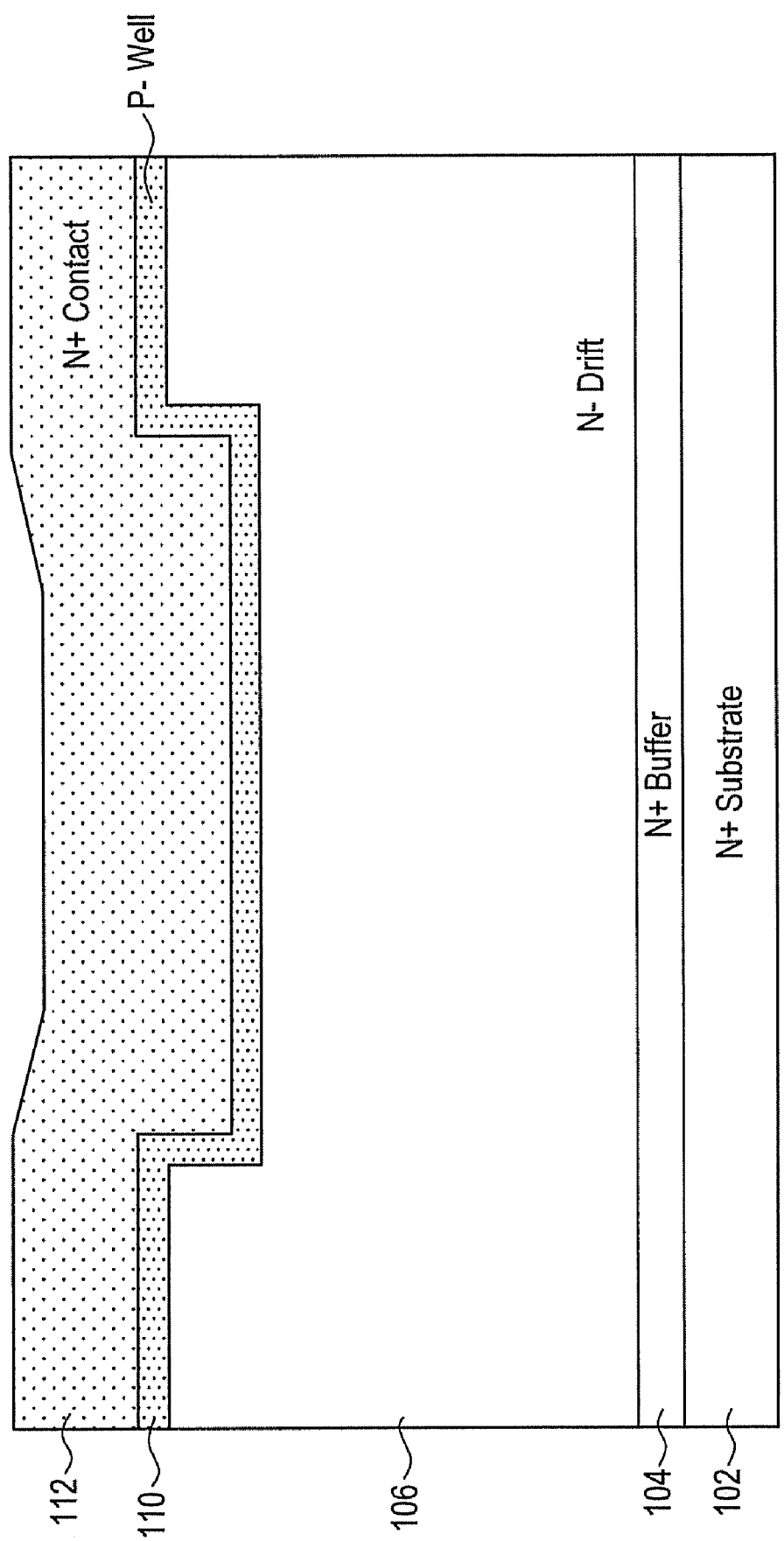
Figure 3:
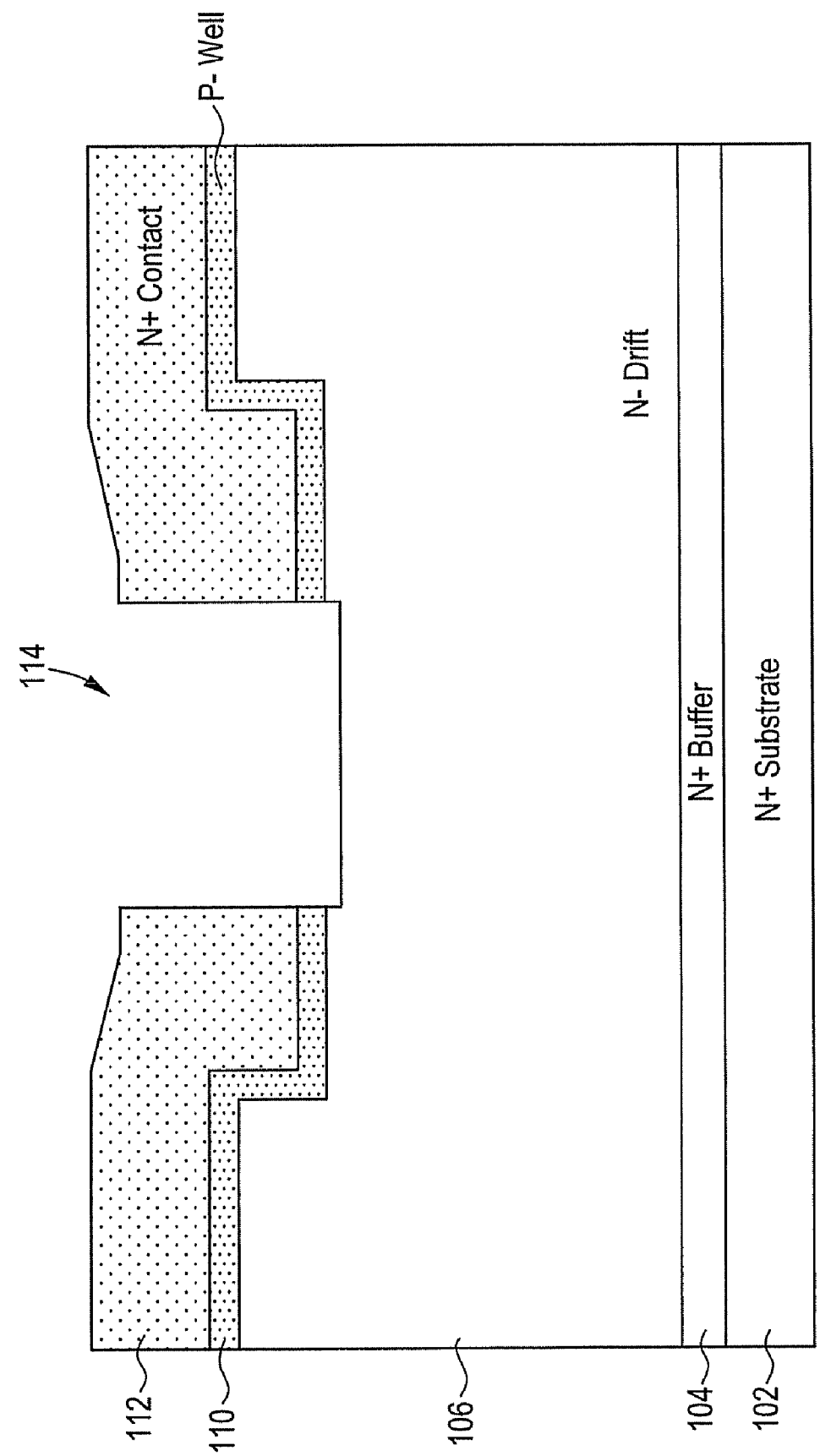

Turning next to FIG. 2, a P-type layer 110 is epitaxially grown over the entire surface of the device, the P-type layer eventually serving as a P-well region of the device. The uniformity in thickness of the P-type layer 110 will ultimately define the channel length of the MOSFET device. Moreover, because the P-type layer material of the P-well region is grown (instead of being formed through ion implantation), the channel region is spared from any adverse effects of implantation.

As also illustrated in FIG. 2, an N+ contact (source) layer 112 is epitaxially grown over the P-type layer 110, thereby refilling the first trench. Once again, the epitaxial/refill approach avoids potential damage and misalignment of doped regions from multiple lithography steps. Then, in FIG. 3, a second trench 114 is formed through the N+ contact layer 112 and at least into the P-well layer 110. As compared to the first trench etch, the second trench 114 is narrower and entirely within the horizontal boundaries of the first trench etch shown in FIG. 1. In the specific example illustrated, the second trench 114 may be etched entirely through the P-well layer 110.

Figure 4:
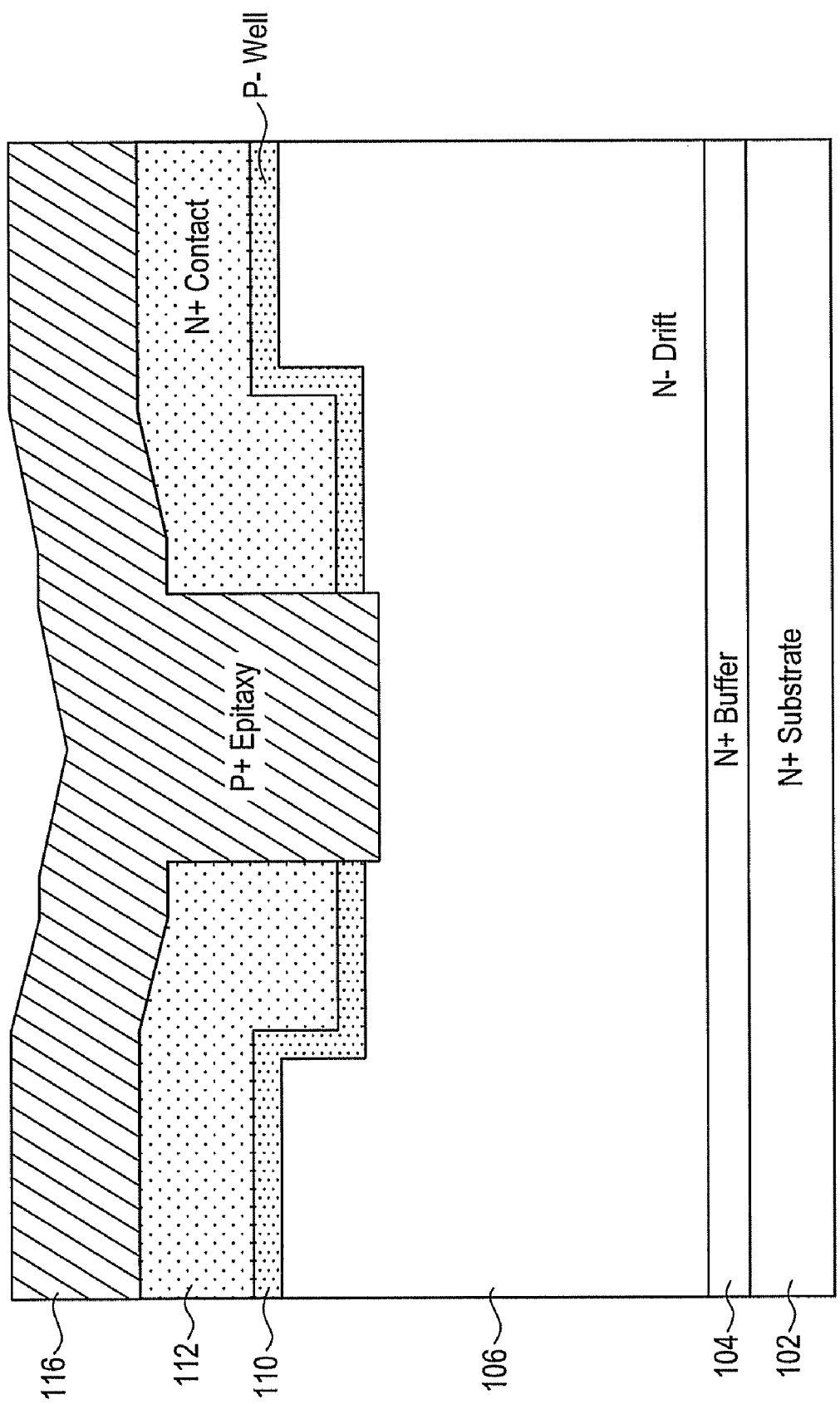
Figure 5:
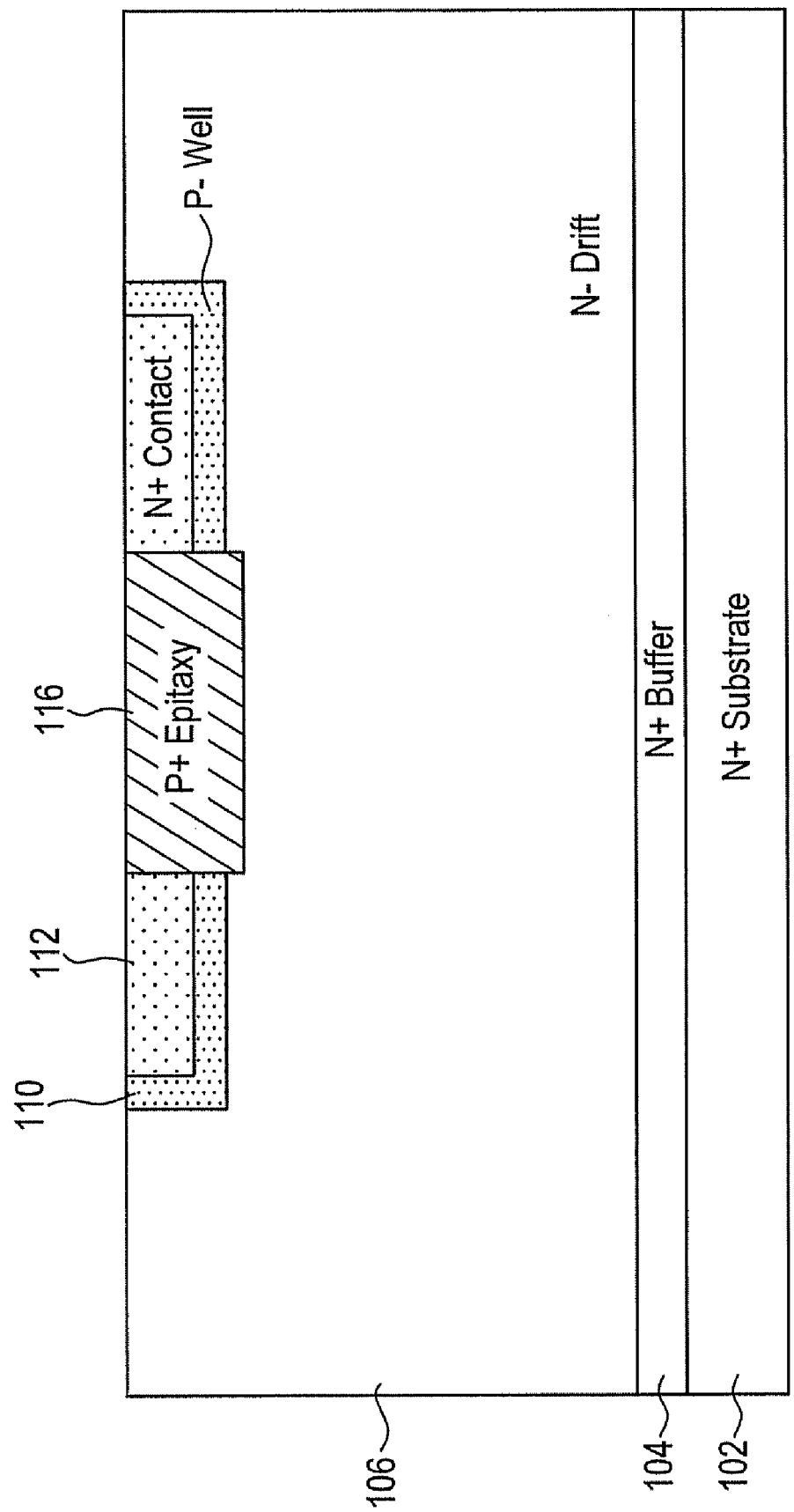

Proceeding to FIG. 4, a P+ layer 116 is then epitaxially grown over the top of the N+ contact layer 112, as well as into the second trench 114 (Refilling the same), and thus on the exposed sidewalls of both the N+ contact layer 112 and the P-well layer 110. As a result, each of the various doped regions of the DMOSFET is formed without the need for ion implantation in this embodiment. As then shown in FIG. 5, the device is planarized down to the level of the N-type drift layer 106. The planarization may be implemented by for example a chemical mechanical polishing (CMP) step to the point shown in FIG. 5 or, alternatively, a two-step process by performing CMP to remove surface topography and achieve an initial flat surface, followed by reactive ion etching (RIE) (e.g., such as by inductively coupled plasma (ICP)) to the point shown in FIG. 5. In either case, it will be seen that the resulting P+ and N+ regions have top surfaces that are substantially coplanar with one another such that a subsequent ohmic contact process does not need to be executed in accordance with the '488 application that calls for vertical etching and formation of ohmic material that connects the N+ region to the P+ region at a location below the level of the N+ region. Moreover, this coplanar N+/P+ region formation is accomplished without the use of ion implantation and the subsequent disadvantages associated therewith.

It should be appreciated that by the term "substantially coplanar," both P+ and N+ regions have at least a portion of their top surface exposed by planarization, which allows for any slightly non-uniform topography that may exist in the upper surface of the P+ region due to various processing conditions. For example, one processing condition that could result is a depression or divot in the upper surface of the P+ region in the event the initial P+ trench width is too small. In this case, the surface will not be completely flat, but will have a slight drop below this top surface. However, with respect to the N+ contact layer, the surfaces are substantially coplanar. Stated another way, a subsequent layer formed over the P+ region and N+ contact layer would be in contact with both such structures.

In an alternative embodiment, a lower portion of the P+ layer may first be formed, prior to P-well and N+ contact epitaxial growth, as well as the subsequent epitaxial growth of an upper portion of the P+ layer that is coplanar with the top surface of the N+ contact layer prior to ohmic contact formation. This lower portion of the P+ layer may be formed, in one embodiment, through ion implantation and, in another embodiment, through epitaxial growth.

Figure 6:
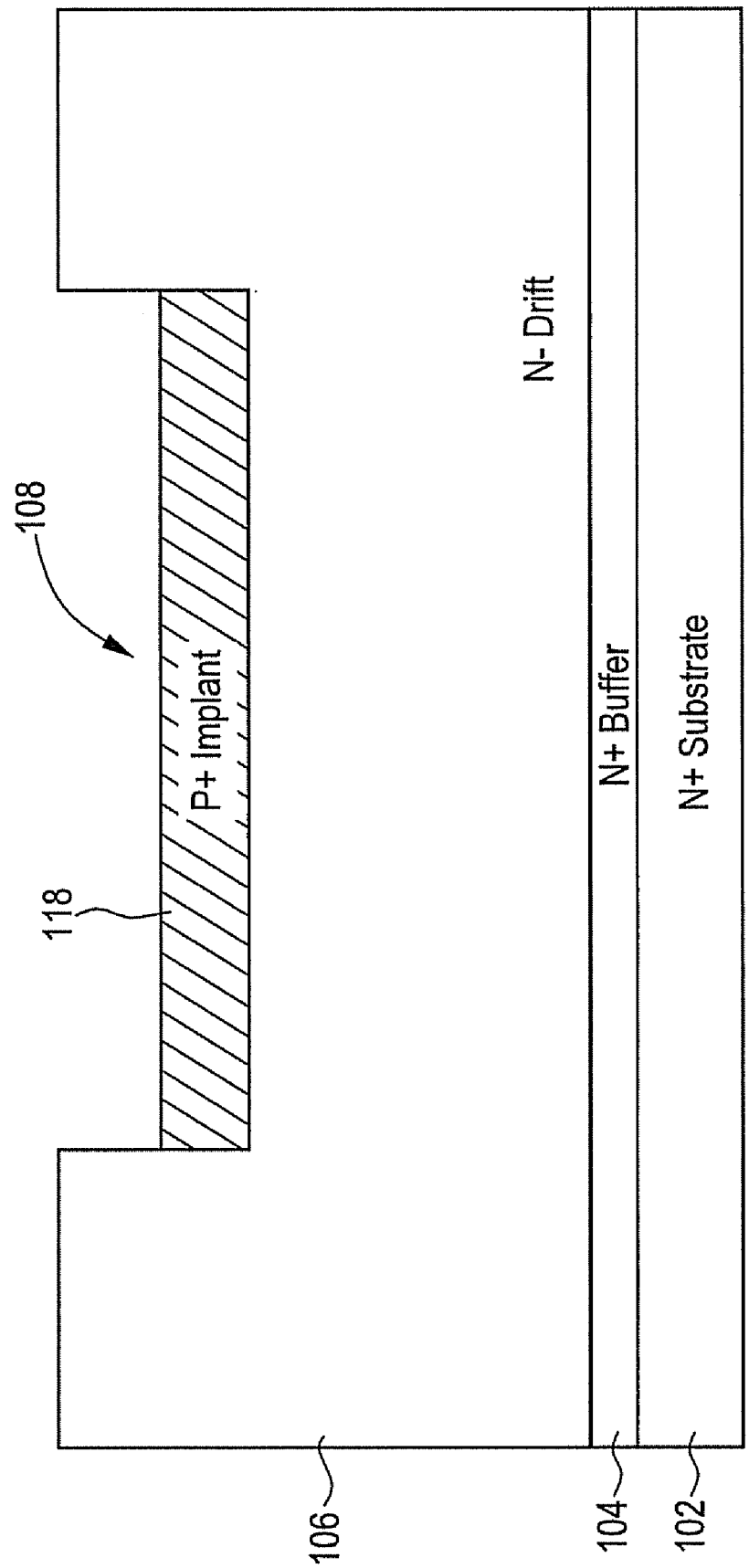
FIGS. 6 through 12 are a series of process flow diagrams illustrating a method of forming a vertical MOSFET device, in accordance with an alternative embodiment of the invention.

As first shown in FIG. 6, after the definition of the first trench 108 within the N-type drift layer 106, a lower P+ region 118 is implanted at the bottom of the first trench 108. In an exemplary embodiment, the lower P+ region 118 may be formed by implantation of a suitable dopant material such as aluminum or boron, for example.

Figure 7:
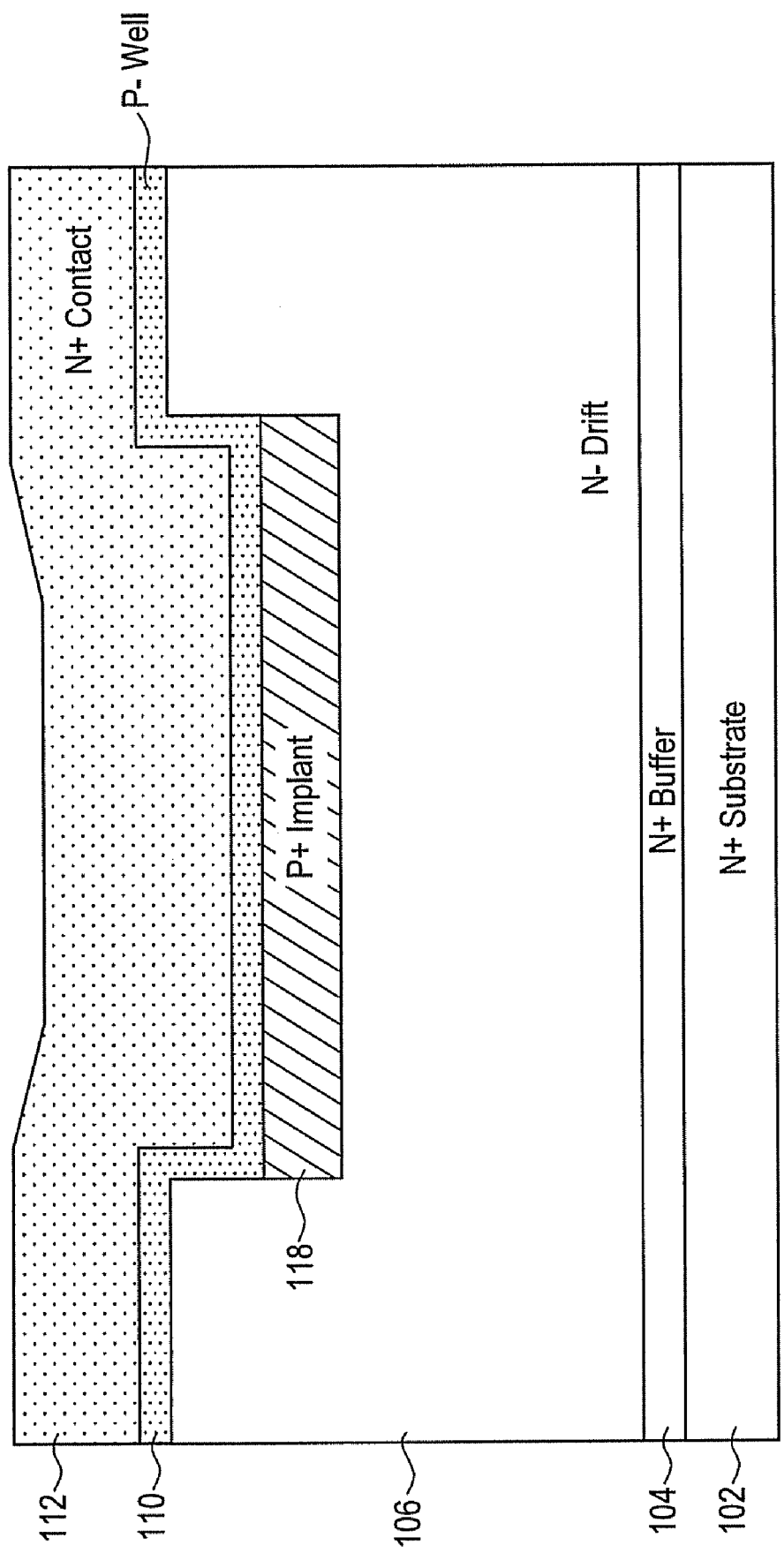
Figure 8:
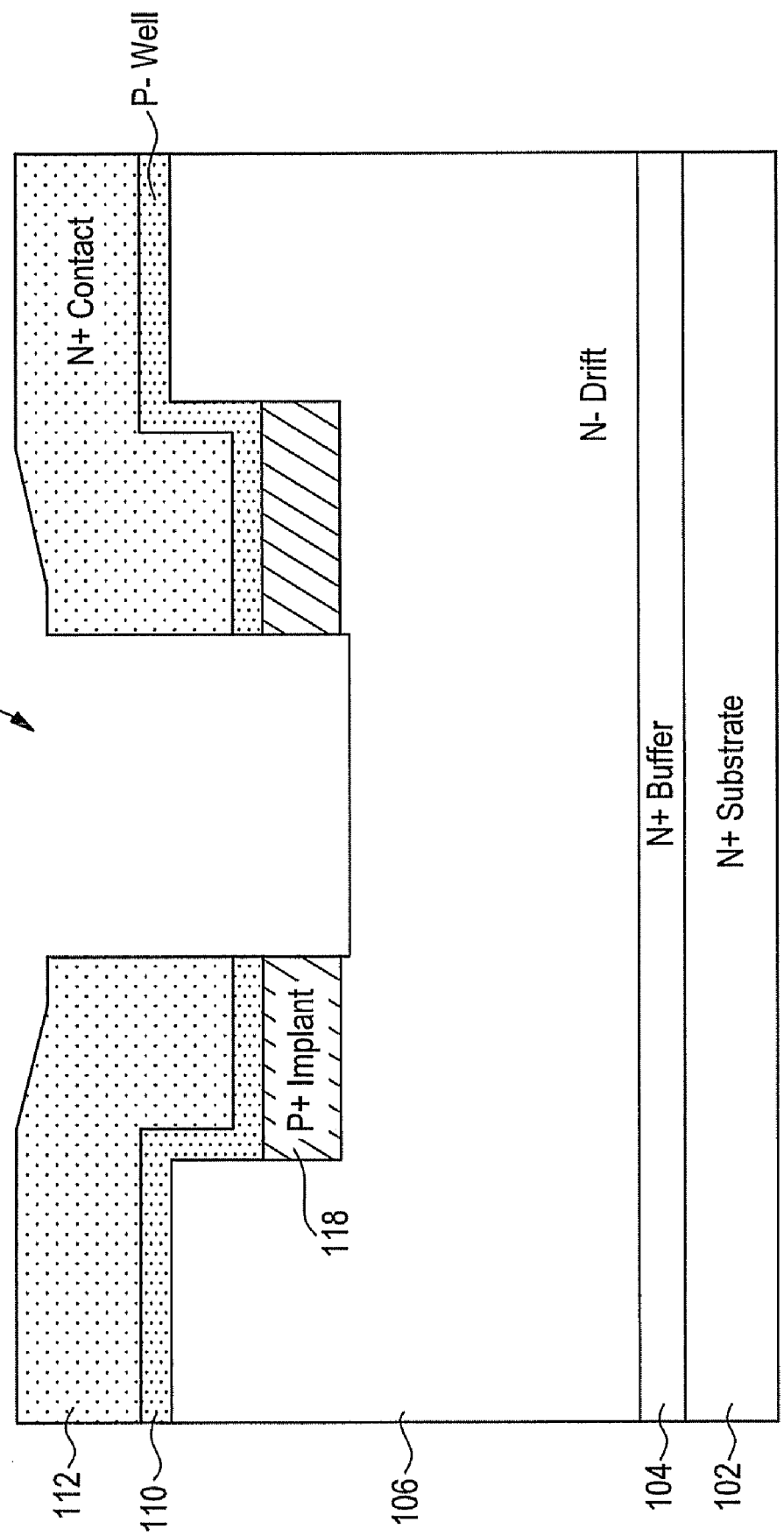

Once the lower P+ region 118 is formed, the P-well layer 110 and N+ contact layer 112 are epitaxially grown as shown in FIG. 7 (similar to the processing shown in FIG. 2). Then, in FIG. 8, the second trench 114 is formed through the N+ contact layer 112, the P-well layer 110, and through the implanted lower P+ region 118. Alternatively, the second trench 114 may be etched entirely through the P-well layer 110 and into the implanted P+ region. However, by etching the second trench entirely through the implant region, contact to the implant layer is made at the sidewalls so as to provide a sharp interface between the bottom of the P+ region 118 and the drift layer 106. Again, as compared to the first trench etch, the second trench 114 is narrower and entirely within the horizontal boundaries of the first trench etch shown in FIG. 6.

Figure 9:
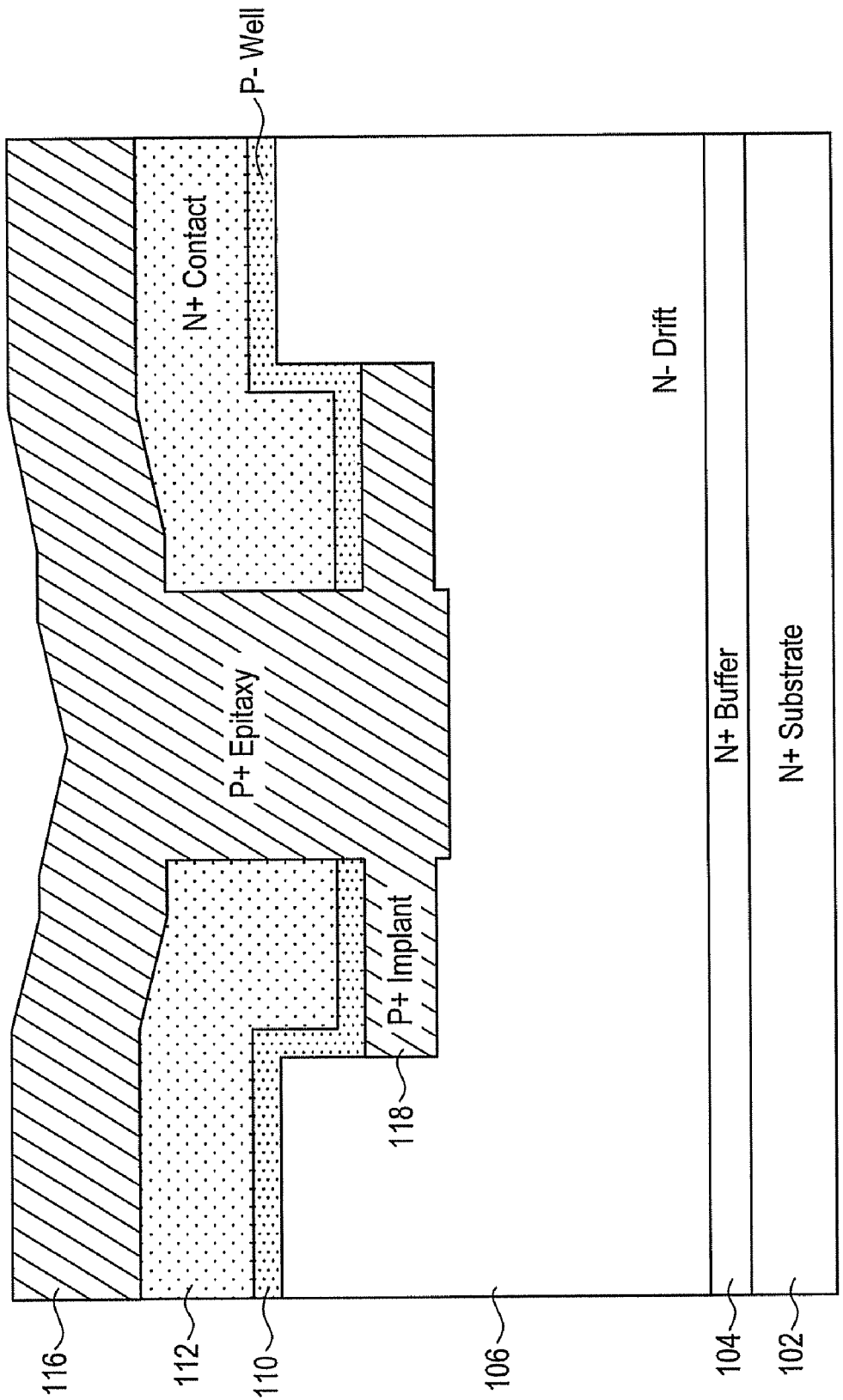
Figure 10:
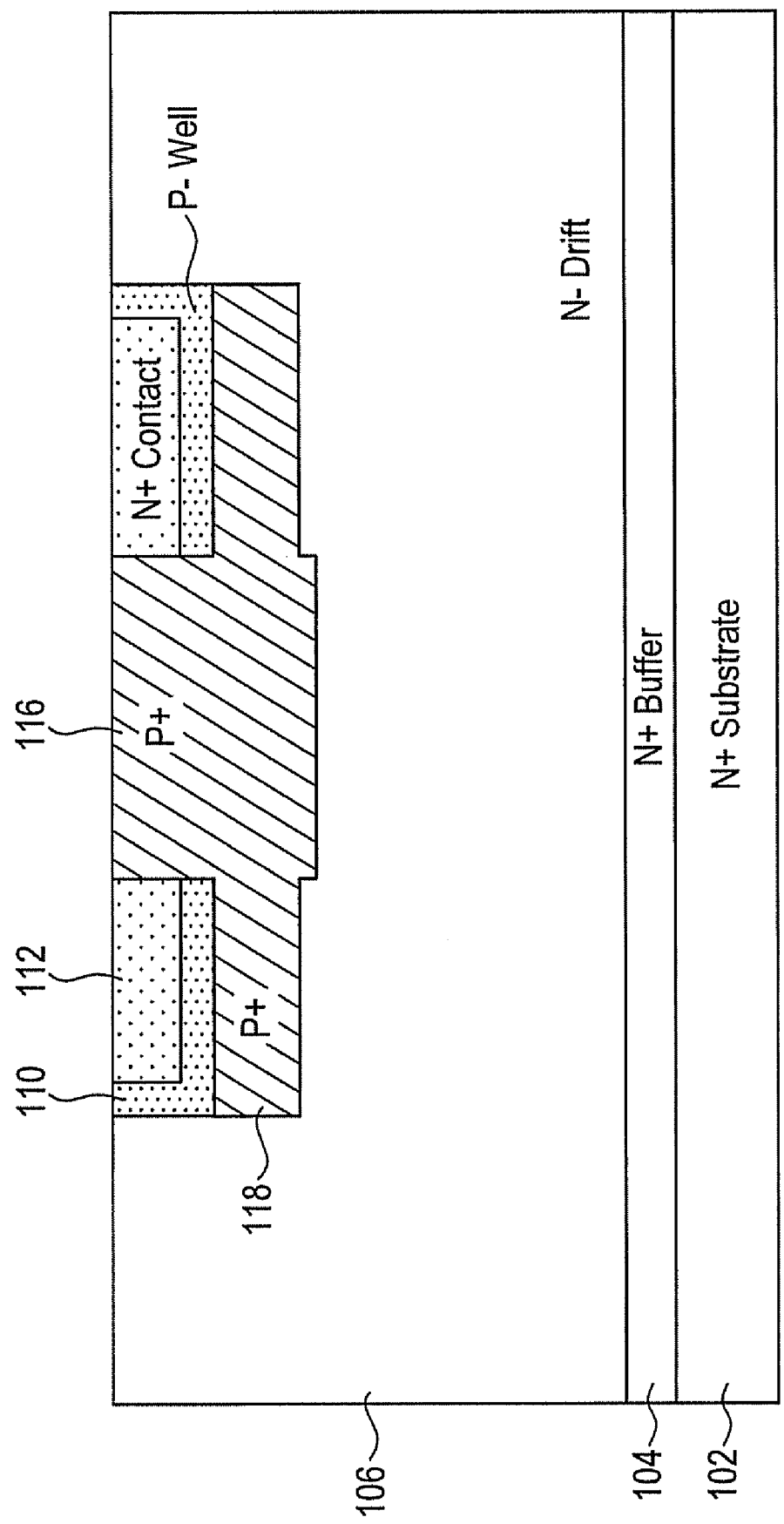

As shown in FIG. 9, an upper P+ region is formed by epitaxially growing a P+ layer 116 over the top of the N+ contact layer 112, as well as into the second trench 114 (refilling the same), on the exposed sidewalls of both the N+ contact layer 112 and the P-well layer 110, and finally on the top of the implanted lower P+ region 118. The resulting structure is planarized in FIG. 10, in a similar manner as that described above with respect to FIG. 5. In comparison with FIG. 5, the embodiment of FIG. 10 (which utilizes the implanted lower P+ region 118) provides additional contact surface with respect to the P-well region 110. Like the first embodiment, however, the P-well region 110, N+ contact region 112 and upper P+ region 116 are all epitaxially grown and all have top surfaces substantially coplanar with one another prior to subsequent ohmic contact formation.

Figure 11:
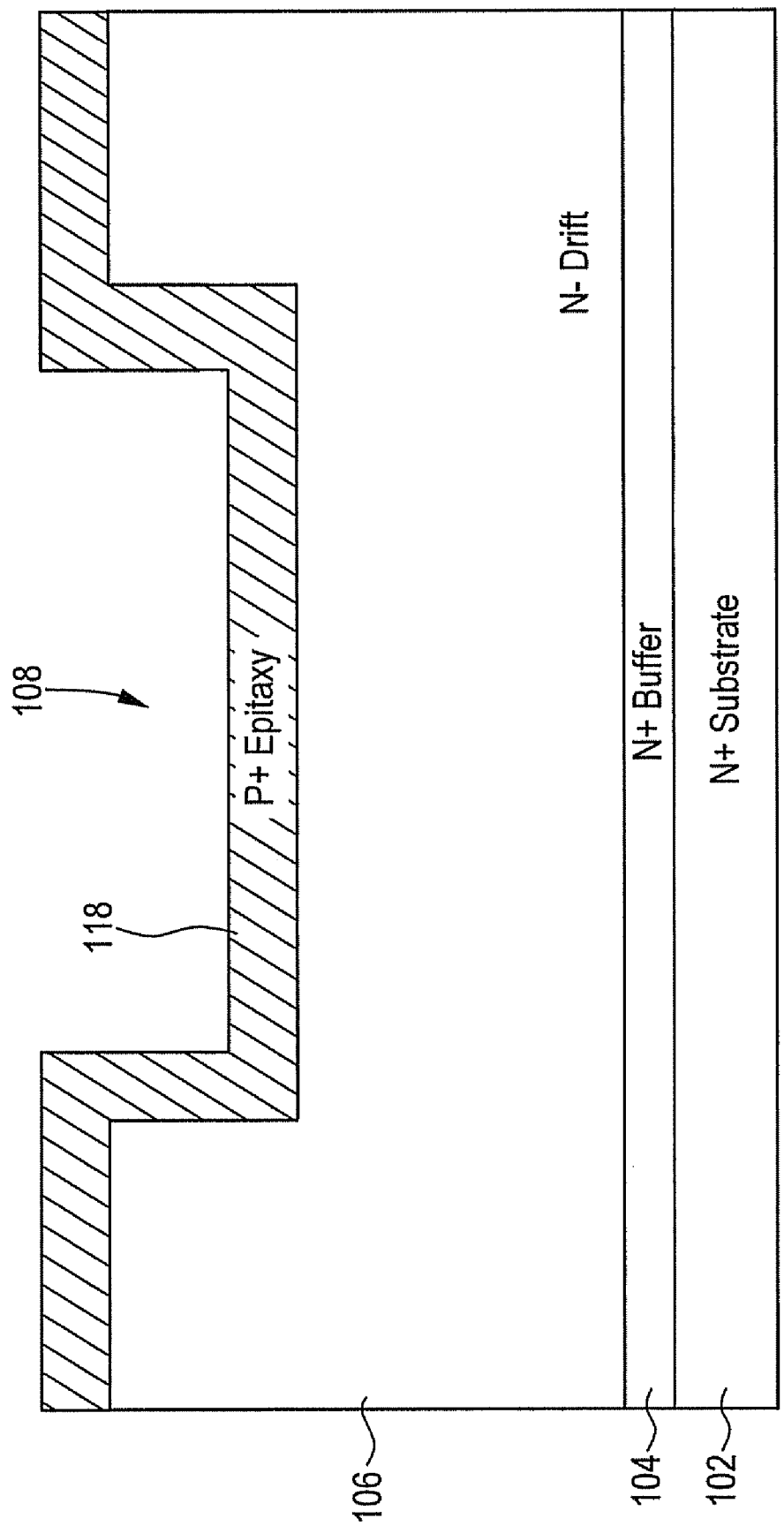
Figure 12:
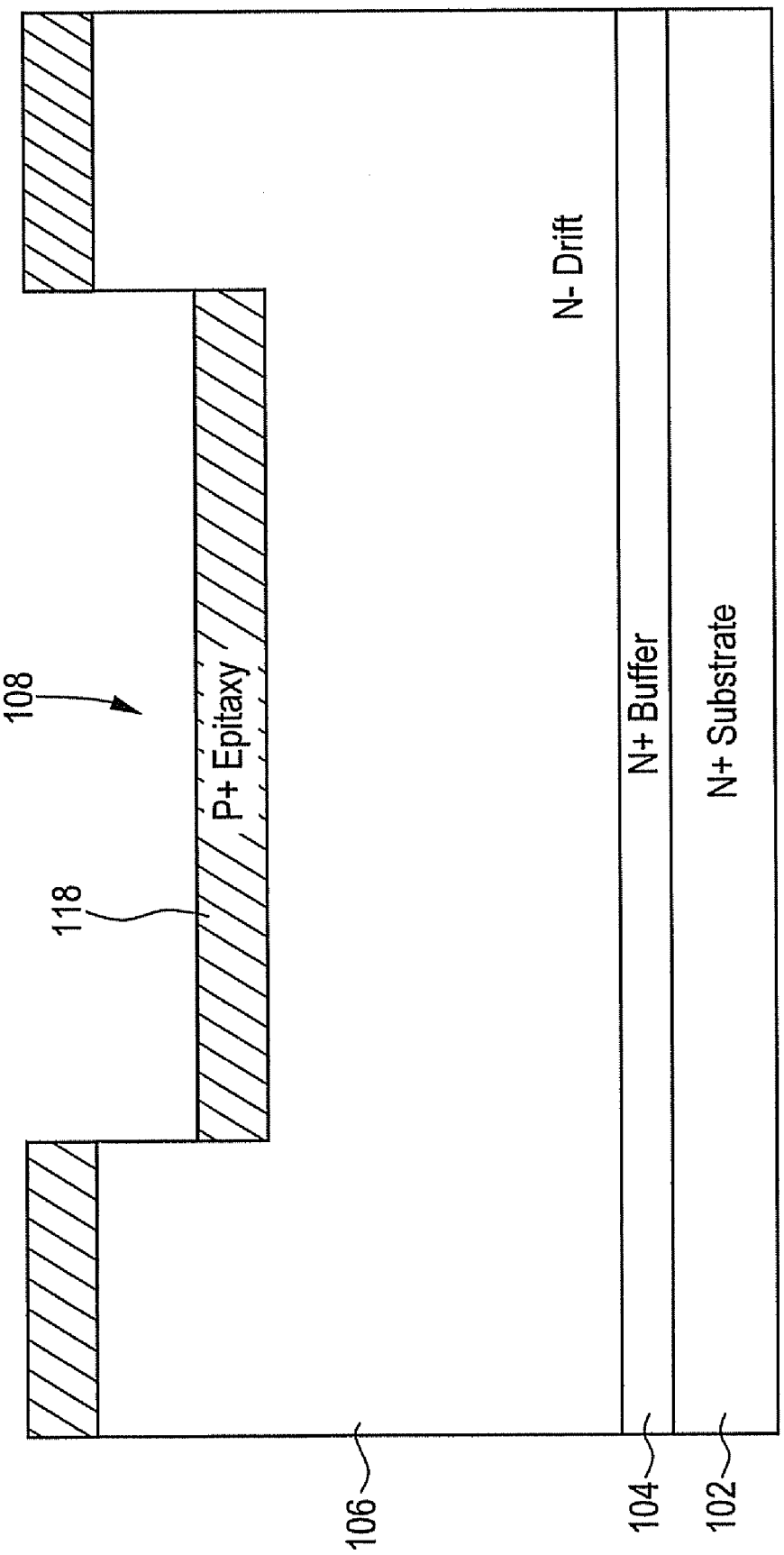

As indicated above, one variation on the formation of lower P+ region 118 in FIG. 6 is to grow the lower P+ layer 118 epitaxially, in lieu of ion implantation. The formation of an epitaxially grown lower P+ layer 118 is thus illustrated in FIG. 11. However, because the epitaxial lower P+ layer 118 is conformally grown, the portions thereof on the sidewalls of the trench 108 are to be removed in order for the device to function. Thus, as shown in FIG. 12, the device is subjected to a thermal oxidation process that is anisotropic with respect to vertical surfaces. More specifically, the oxidation rate of vertical surfaces is roughly 5 times that of the horizontal surfaces. Thus, the oxidation serves to selectively "consume" the lower P+ layer on the sidewall in its entirety, while only consuming a small portion of the P+ layer on the planar surface. After removal of the P+ material from the trench sidewalls, the portions of the P+ material 118 on the top surfaces of the drift layer 106 may be removed by polishing, for example, prior to continuing processing as was illustrated in FIGS. 7-10.

Figure 13:
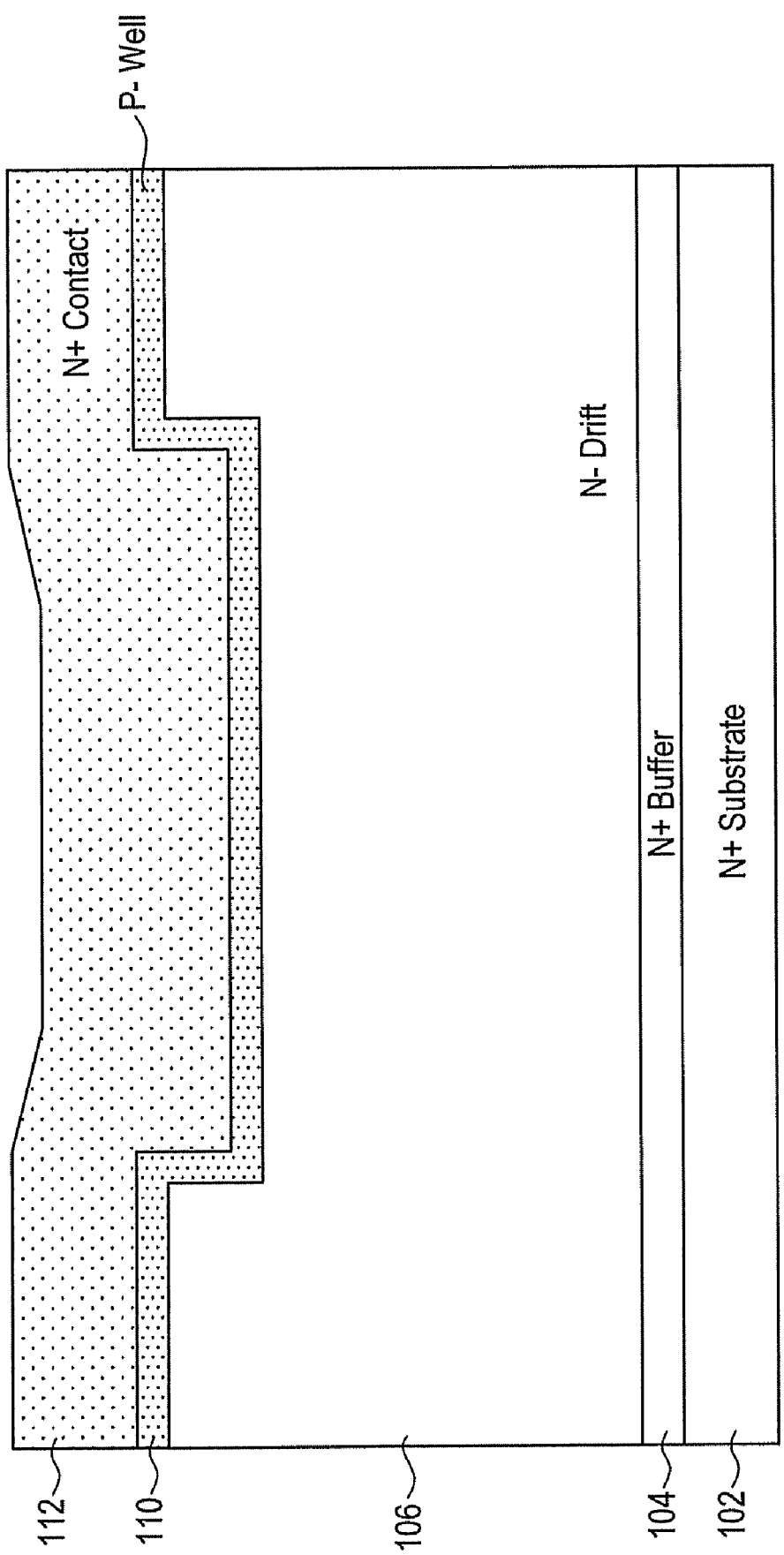
FIGS. 13 through 17 are a series of process flow diagrams illustrating an alternative processing sequence applicable to the embodiments of FIGS. 1-5 and FIGS. 6-12.
Figure 14:
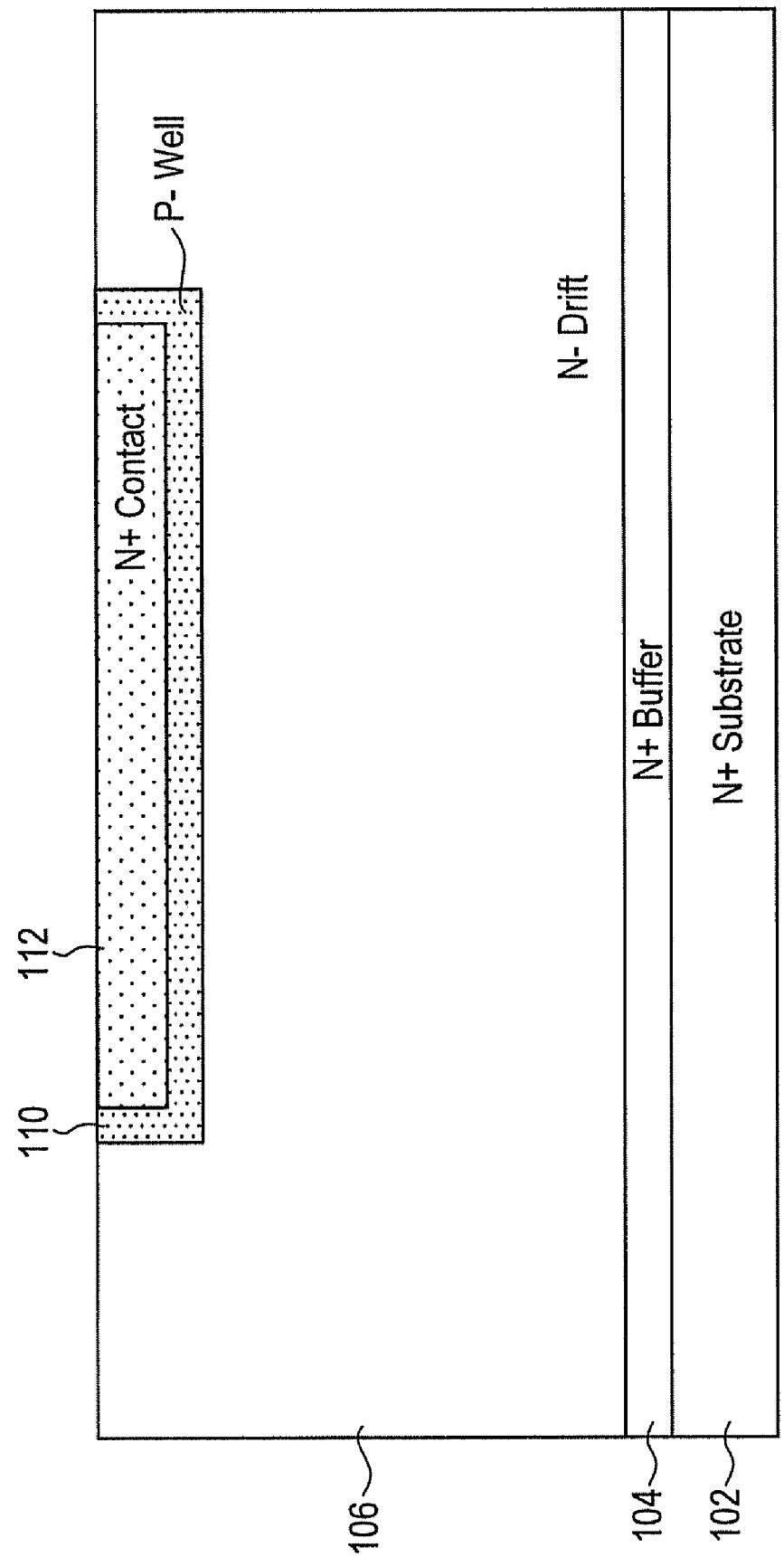

FIGS. 13 through 17 are a series of process flow diagrams illustrating an alternative processing sequence applicable to the both embodiments of FIGS. 1-5 and FIGS. 6-12. For purposes of illustration only, FIGS. 13 through 17 illustrate an alternative sequence for the embodiment of FIGS. 1-5, but it will be understood that the sequence is equally applicable to the lower P+ embodiment of FIGS. 6-12. Referring now to FIG. 13, the point in processing up to the illustration of FIG. 2 is depicted. That is, a first trench is etched within the N-type drift layer 106, followed by epitaxial growth of both the P-type layer 110 and the N+ contact (source) layer 112 over the P-type layer 110, thereby refilling the first trench. However, rather then forming the second trench at this point, layers 110 and 112 are then planarized by CMP down to the drift layer 106 as shown in FIG. 14.

Figure 15:
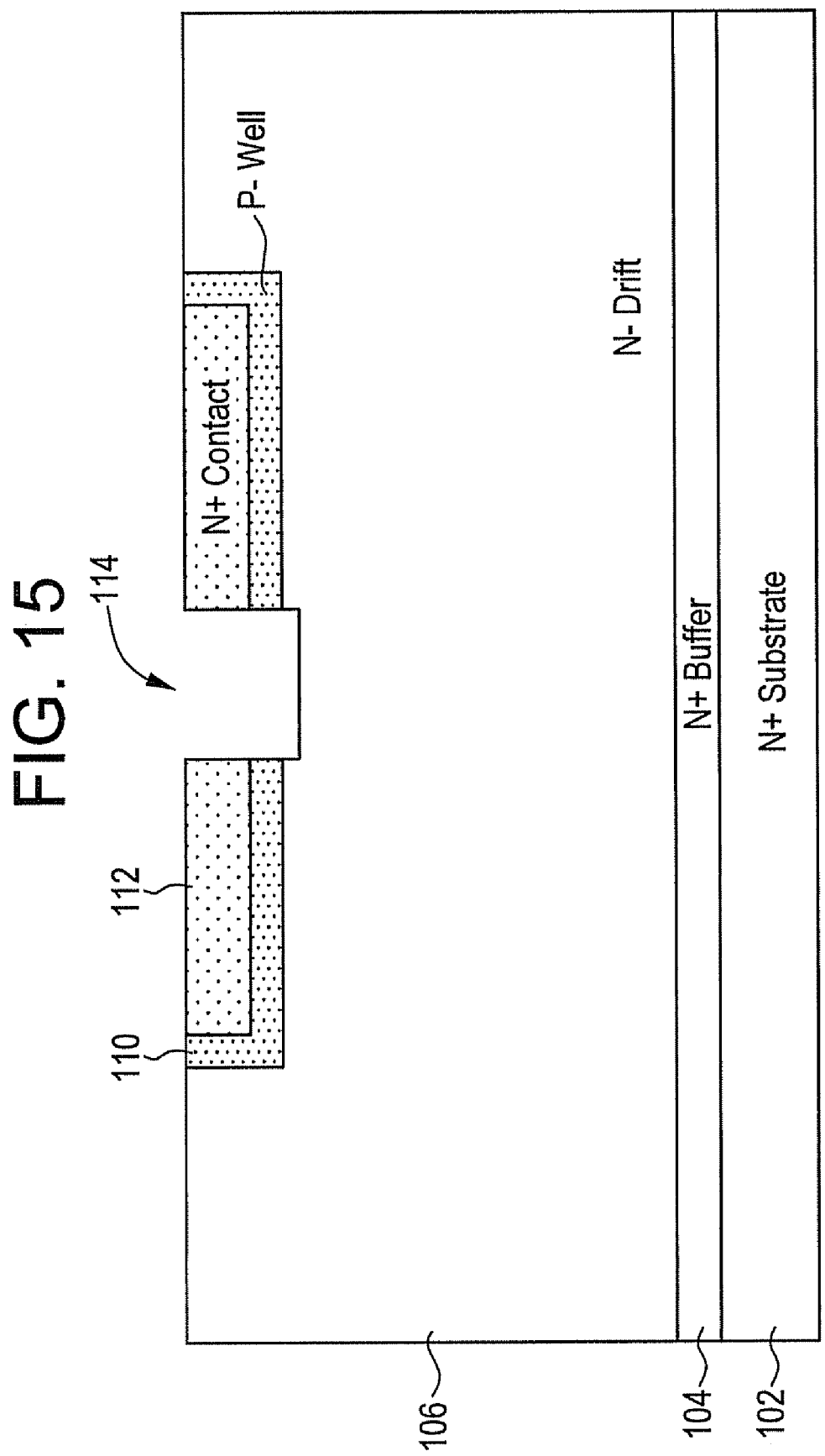
Figure 16:
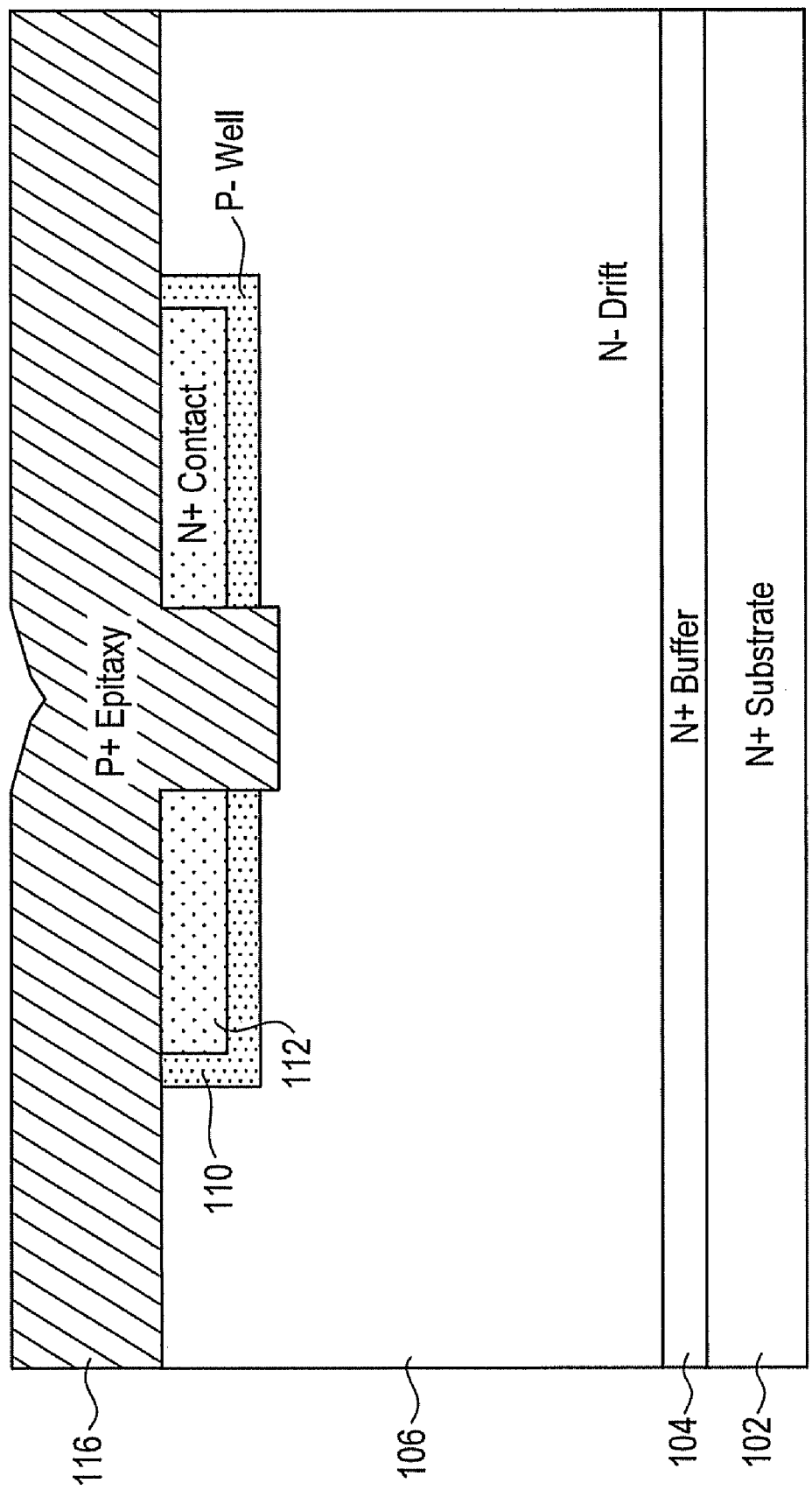
Figure 17:
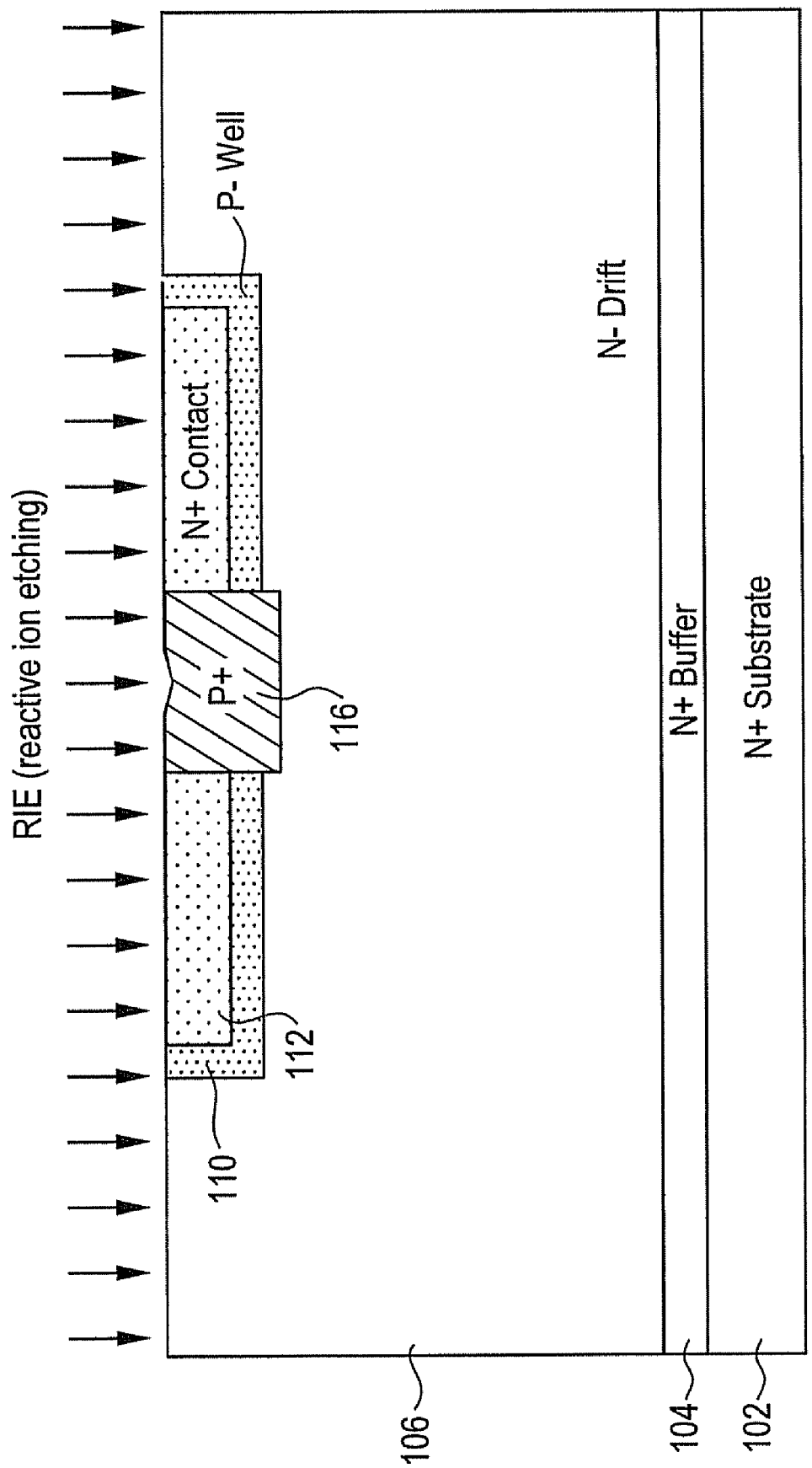

Then, after planarization, the second trench 114 is formed as shown in FIG. 15. This is followed by epitaxial growth of the P+ layer 116 over the N+ contact layer 112 so as to refill the second trench 114, as shown in FIG. 16. It will be noted that by planarizing layers 110 and 112 prior to trench formation, the second trench may be made shallower and narrower, since it does not need to be formed through the N+ and p-well layers as well. This will enable improvement in MOSFET cell density and electrical performance. The resulting topography of the epitaxially grown P+ layer 116 in FIG. 14 is such that it is substantially flat. As a result, the subsequent removal of the excess P+ material as shown in FIG. 17 may be accomplished, for example, by reactive ion etching (RIE), in lieu of chemical mechanical polishing as discussed above.

Figure 18:
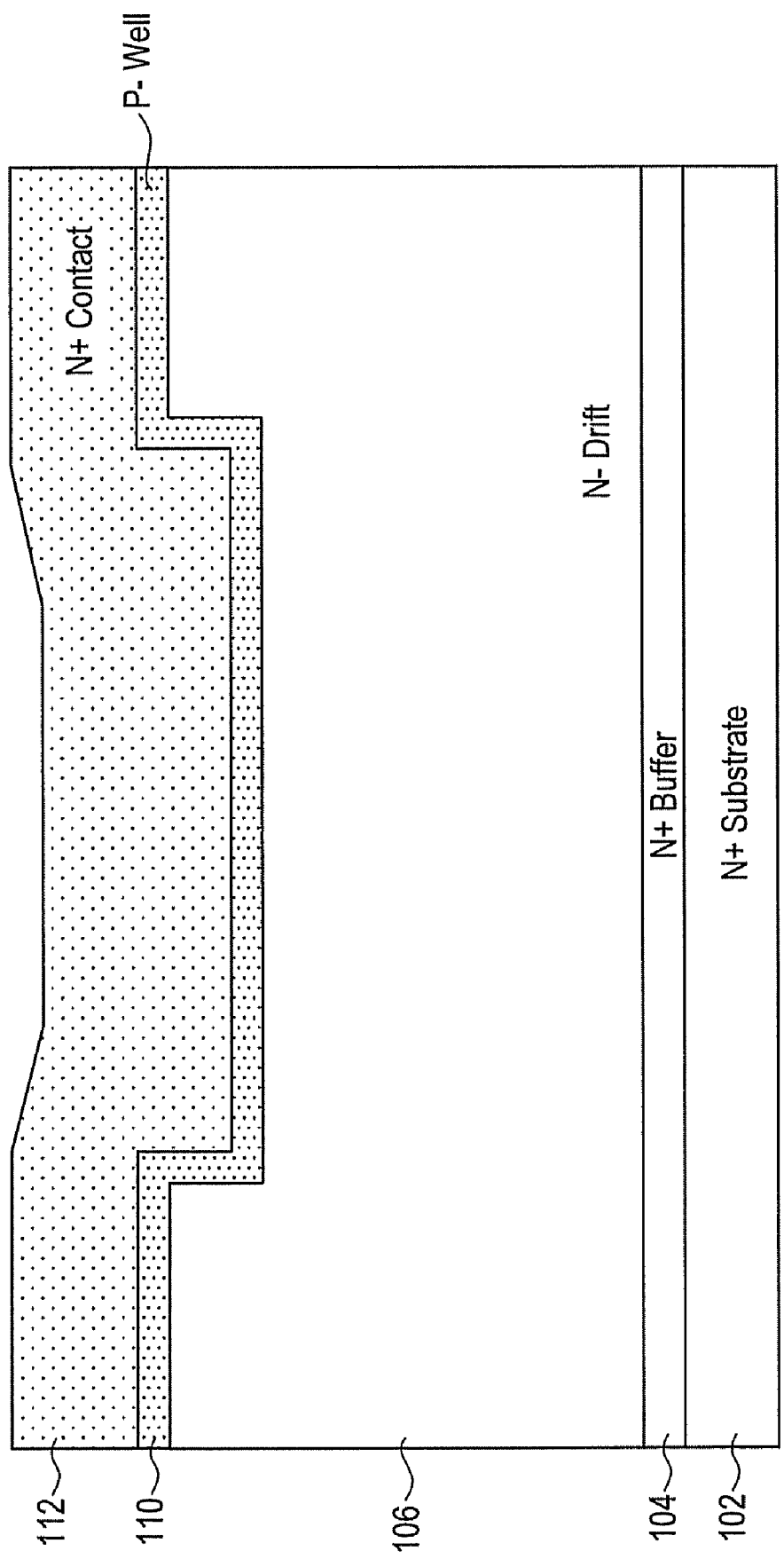
Figure 19:
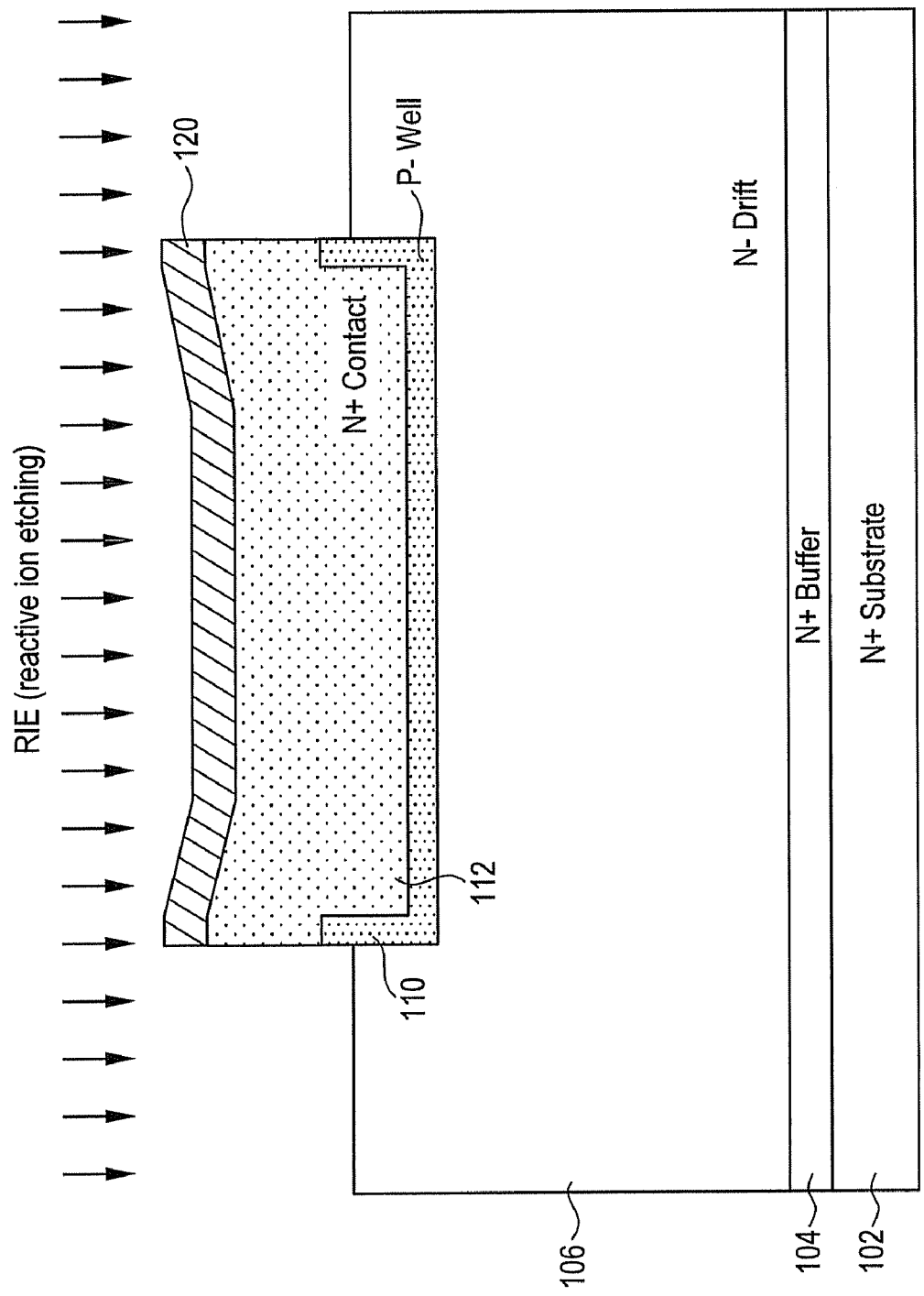

Finally, FIGS. 18 through 20 are a series of process flow diagrams illustrating an alternative processing sequence applicable to the embodiments of FIGS. 13-17. Again, this alternative sequence could be applied to both the embodiment of FIGS. 1-5 and the lower P+ embodiment of FIGS. 6-12. FIG. 18 summarizes the point in processing up to the illustration of FIG. 13. That is, a first trench is etched within the N-type drift layer 106, followed by epitaxial growth of both the P-type layer 110 and the N+ contact (source) layer 112 over the P-type layer 110, thereby refilling the first trench. However, in lieu of CMP of the entirety of the N+ contact layer 112 and P-type layer 110 at portions outside the first trench as in FIG. 14, a protective mask layer 120 is instead patterned over the device, corresponding to the patterning of the first trench. Then, exposed portions of the N+ contact layer 112 and P-type layer 110 located outside the boundaries of the first trench are removed by RIE so as to expose the top surface of the drift layer 106, as shown in FIG. 19. Thereby, the remaining topography due to the N+ contact layer 112 and P-type layer 110 is localized over the first trench region. In an exemplary embodiment, the same mask may be used for patterning the protective mask layer 120 as for the first trench 108 (e.g., as shown in FIG. 1), wherein the protective mask layer 120 may be a photoresist material or other suitable hardmask material known in the art that provides etch selectivity with respect to the N+ contact layer 112 and P-type layer 110.

Then, as shown in FIG. 20, the remaining N+ contact layer 112 and P-type layer 110 topography is removed by CMP (wherein the remaining mask material 120 may either be removed by CMP or separately removed prior to CMP by other methods known in the art. By masking off the first trench area and initially etching etch down to the drift layer surface (the desired stopping point for CMP), the CMP technicians will more easily be able to determine the endpoint for the CMP operation as the drift layer 106 is already exposed prior to CMP. Moreover, RIE is more easily controlled than CMP, thus lessening the risk of CMP proceeding too far.

In addition to the benefits discussed above, another advantage of each of the presently disclosed embodiments (from a structural standpoint) is realized upon consideration of the nature of epitaxially grown regions versus ion-implanted regions in MOSFET fabrication. More specifically, with epitaxially grown regions (e.g., p-well, N+, P+), the interfaces therebetween are very sharp in that they occur along a well-defined boundary line in which there is one doping concentration on one side of the boundary and a substantially different doping concentration on the other side of the boundary. On the other hand, with ion implantation, there is a blurred or "fuzzy" interface between doped regions. For example, at the edge of the P+ implant into the N− substrate, there is an interface where the doping gradually transitions from a heavily P-doped region to an N-doped substrate over some distance.

It should be appreciated that although the exemplary embodiments discussed herein have been presented in terms of an NFET (i.e., N+ source/drain regions), the principles are equally applicable to PFET devices (i.e., P+ source/drain regions).

It should further be appreciated that although the exemplary embodiments of present invention are depicted in terms of vertical MOSFET devices, the epitaxial refilling technique can also be used as a substitute in the formation of other types of devices including, but not limited to: planar MOSFETs, JFETs, IGBTs, BJTs, Schottky diodes, etc. In additional, other portions of vertical devices, such as epitaxially grown body contacts and/or guard rings may be formed, thereby facilitating a completely implant free process.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of forming a vertical MOSFET device, the method comprising:
   forming a first trench within a substrate of a first polarity type, the first trench generally defining a well region of a second polarity type opposite the first polarity type;
   growing a first epitaxial layer of the second polarity type over the substrate and sidewall surfaces of the first trench, the first epitaxial layer comprising a well layer;
   growing a second epitaxial layer of the first polarity type over the well layer of the second polarity type, the second layer comprising a source contact layer;
   forming a second trench through the source contact layer and at least through a portion of the well layer;
   growing a third epitaxial layer of the second polarity type over the source contact layer so as to refill the second trench; and
   planarizing at least the first and second epitaxial layers so as to expose an upper surface of the substrate, wherein a top surface of the third epitaxial layer is substantially coplanar with a top surface of the source contact layer prior to a subsequent ohmic contact formation therebetween.

2. The method of claim 1, wherein the second trench is narrower and entirely within horizontal boundaries of the first trench.

3. The method of claim 1, wherein the first polarity type is N-type silicon carbide and the second polarity type is P-type silicon carbide.

4. The method of claim 1, wherein the substrate further comprises a drift layer formed over a drain region, with a buffer layer therebetween, the drift layer, buffer layer and drain region comprising a first polarity type with the drain region having a greater dopant concentration with respect to the drift layer.

5. The method of claim 1, further comprising planarizing the third epitaxial layer so as to expose the upper surface of the substrate.

6. The method of claim 1, wherein the second trench is formed subsequent to the planarizing of the first and second epitaxial layers.

7. The method of claim 6, further comprising protecting portions of the first and second epitaxial layers located directly above the first trench and then removing, by reactive ion etching, remaining unprotected portions of the first and second epitaxial layers so as to expose the upper surface of the substrate prior to planarizing the protected portions of the first and second epitaxial layers by chemical mechanical polishing.

8. The method of claim 7, further comprising removing excess portions of the third epitaxial layer by reactive ion etching.

9. The method of claim 7, further comprising planarizing the third epitaxial layer by chemical mechanical polishing.

10. A method of forming a vertical MOSFET device, the method comprising:
    forming a drift layer over a drain region substrate, with a buffer layer therebetween, the drift layer, buffer layer and drain region comprising a first polarity type with the drain region having a greater dopant concentration with respect to the drift layer;
    forming a first trench within the drift layer, the first trench generally defining a well region of a second polarity type opposite the first polarity type;
    forming a lower region of the second polarity type at the bottom of the first trench over the drift layer;
    growing a first epitaxial layer of the second polarity type over the drift layer, sidewall surfaces of the trench and the lower region of the second polarity type, the first epitaxial layer comprising a well layer;
    growing a second epitaxial layer of the first polarity type over the well layer of the second polarity type, the second layer comprising a source contact layer;
    forming a second trench through the source contact layer and at least through a portion of the well layer;
    growing a third epitaxial layer of the second polarity type over the source contact layer so as to refill the second trench, wherein the third epitaxial layer of the second polarity type comprises an upper region of the second polarity type; and
    planarizing at least the first and second epitaxial layers so as to expose an upper surface of the drift layer, wherein a top surface of the third epitaxial layer is substantially coplanar with a top surface of the source contact layer prior to a subsequent ohmic contact formation therebetween.

11. The method of claim 10, wherein the second trench is narrower and entirely within horizontal boundaries of the first trench.

12. The method of claim 10, wherein the first polarity type is N-type silicon carbide and the second polarity type is P-type silicon carbide.

13. The method of claim 10, wherein the second trench is etched entirely through the source contact layer, the well layer, and the lower region of the second polarity type.

14. The method of claim 10, wherein the lower region of the second polarity type is formed by implanting a bottom surface of the first trench with a dopant of the second polarity type prior to growing the well layer.

15. The method of claim 10, wherein the lower region of the second polarity type is formed by epitaxial growth followed by selective consumption of epitaxial material formed on sidewalls of the first trench.

16. The method of claim 10, further comprising planarizing the third epitaxial layer so as to expose the upper surface of the drift layer.

17. The method of claim 10, wherein the second trench is formed subsequent to the planarizing of the first and second epitaxial layers.

18. The method of claim 17, further comprising protecting portions of the first and second epitaxial layers located directly above the first trench and then removing, by reactive ion etching, remaining unprotected portions of the first and second epitaxial layers so as to expose the upper surface of the drift prior to planarizing the protected portions of the first and second epitaxial layers by chemical mechanical polishing.

19. The method of claim 18, further comprising removing excess portions of the third epitaxial layer by reactive ion etching.

20. The method of claim 18, further comprising planarizing the third epitaxial layer by chemical mechanical polishing.

21. A vertical MOSFET device, comprising:
- a drift layer formed over a drain region substrate, the drift layer and drain region comprising a first polarity type with the drain region having a greater dopant concentration with respect to the drift layer;
- a well region formed in an upper portion of the drift layer, the well region of a second polarity type opposite the first polarity type, the well region further comprising a first epitaxially grown region;
- a source contact region of the first polarity type surrounded at side and bottom surfaces thereof by the well region, the source contact region comprising a second epitaxially grown region; and
- a third epitaxially grown region formed through the source contact region and the well region so as to make electrical contact therewith;
- wherein a top surface of the third epitaxially grown region and a top surface of the source contact region are substantially coplanar with one another.

22. The device of claim 21, wherein the first polarity type is N-type and the second polarity type is P-type.

23. The device of claim 21, wherein the first polarity type is N-type silicon carbide and the second polarity type is P-type silicon carbide.

24. The device of claim 21, further comprising a lower region of the second polarity type formed over the drift layer and below the well region.

25. The device of claim 24, wherein a bottom surface of the third epitaxially grown region extends through the lower region of the second polarity type.

* * * * *